(12) United States Patent
Xia et al.

(10) Patent No.: US 8,913,339 B2
(45) Date of Patent: Dec. 16, 2014

(54) SYSTEMS AND METHODS FOR ADAPTIVE GAIN CONTROL

(75) Inventors: Haitao Xia, San Jose, CA (US); Yu Liao, Longmont, CO (US)

(73) Assignee: LSI Corporation, San Jose, CA (US)

( * ) Notice: Subject to any disclaimer, the term of this patent is extended or adjusted under 35 U.S.C. 154(b) by 144 days.

(21) Appl. No.: 13/346,556

(22) Filed: Jan. 9, 2012

(65) Prior Publication Data
US 2013/0176640 A1 Jul. 11, 2013

(51) Int. Cl.
*G11B 5/035* (2006.01)

(52) U.S. Cl.
USPC .......................................... 360/65

(58) Field of Classification Search
None
See application file for complete search history.

(56) References Cited

U.S. PATENT DOCUMENTS

2011/0093517 A1* 4/2011 Liu et al. ................. 708/207
2012/0230173 A1* 9/2012 Nakamura et al. ......... 369/59.22

FOREIGN PATENT DOCUMENTS

WO    WO 2010080155 A1 *  7/2010

* cited by examiner

*Primary Examiner* — Daniell L Negron
(74) *Attorney, Agent, or Firm* — Hamilton DeSanctis & Cha

(57) ABSTRACT

Various embodiments of the present invention provide systems and methods for data processing. For example, a data processing system is discussed that includes: an analog to digital converter circuit, a data detector circuit, a filter circuit, an error generation circuit, and a target parameter adaptation circuit. The analog to digital converter circuit converts an analog input into corresponding digital samples. The data detector circuit applies a data detection algorithm to a data set derived from the digital samples to yield a detected output. The filter circuit convolves the detected output with a target parameter to yield a target output. The error generation circuit calculates an error value based on the digital samples and the target output. The target parameter adaptation circuit updates the target parameter based at least in part on the error value.

20 Claims, 4 Drawing Sheets

SYSTEMS AND METHODS FOR ADAPTIVE GAIN CONTROL

BACKGROUND OF THE INVENTION

The present inventions are related to systems and methods for data processing, and more particularly to systems and methods for adaptive data processing.

Various data processing circuits have been developed that include a variable gain amplifier that amplifies an analog signal to yield an amplified signal. An analog to digital converter circuit converts the amplified signal into a number of digital samples representing the amplified signal. The digital samples equalized to yield an equalized output, and the equalized output is further processed by data detector and/or data decoder circuitry to yield a data output. In some cases, the amplified signal is noisy to the extent that data processing is undermined.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for adaptive data processing.

Various embodiments of the present invention provide data processing systems that include: an analog to digital converter circuit, a data detector circuit, a filter circuit, an error generation circuit, and a target parameter adaptation circuit. The analog to digital converter circuit is operable to convert an analog input into corresponding digital samples. The data detector circuit is operable to apply a data detection algorithm to a data set derived from the digital samples to yield a detected output. The filter circuit is operable to convolve the detected output with a target parameter to yield a target output. The error generation circuit is operable to calculate an error value based on the digital samples and the target output. The target parameter adaptation circuit is operable to update the target parameter based at least in part on the error value. In some instances of the aforementioned embodiments, the system is implemented as part of a storage device or a communication device. In various instances of the aforementioned embodiments, the data processing system is implemented as part of an integrated circuit.

In various instances of the aforementioned embodiments, the data processing system further includes a variable gain amplifier circuit operable to amplified a received signal by a gain to yield an amplified signal. In such instances, the analog input is derived from the amplified signal, and the gain is governed at least in part by the error value. In one or more instances of the aforementioned embodiments, convolving the detected output with the target parameter to yield the target output is done in accordance with the following equation:

$$\text{Target Output}(k) = \sum_{j=0}^{D-1} (\text{Target Parameter})_j b_{k-j},$$

wherein k indicates a particular instance, b is the detected output, j is a counter value, and D corresponds to the total number of values in the target parameter. In particular instances of the aforementioned embodiments, the target output is a five value output.

In various instances of the aforementioned embodiments, the system further includes an equalizer circuit operable to equalize the digital samples to yield the data set. In some cases, the target parameter adaptation circuit is operable to select a first value of the target parameter and to store the error value corresponding to the first value, and to select a second value of the target parameter and to store the error value corresponding to the second value. In some such cases, the target parameter adaptation circuit is further operable to compare the error value corresponding to the first value with the error value corresponding to the second value, and to select the first value for the target parameter where the error value corresponding to the first value is greater than the error value corresponding to the second value.

Other embodiments of the present invention provide methods for data processing. Such methods include: converting an analog input into a corresponding series of digital samples using an analog to digital converter circuit; applying a data detection algorithm to a data set derived from the digital samples to yield a detected output; convolving the detected output with a target parameter to yield a target output; calculating an error value based on the digital samples and the target output; and updating the target parameter based at least in part on the error value. In some instances of the aforementioned embodiments, the methods further include amplifying a received signal by a gain to yield an amplified signal. In such instances, the analog input is derived from the amplified signal, and the gain varies based at least in part on the error value This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for adaptive data processing.

Various embodiments of the present invention provide data processing circuits that include an analog to digital converter circuit that provides a series of digital samples to an equalizer circuit. The equalizer circuit in turn provides an equalized output to which a data detection algorithm is applied to yield a detected output. The detected output is convolved with an adaptively modified target to yield a target output. A difference between the series of digital samples and the target output is provided as an error value. The error value is used to generate a gain of a variable gain amplifier feeding the analog to digital converter circuit, and to guide adaptation of the adaptively modified target.

Figure 1:
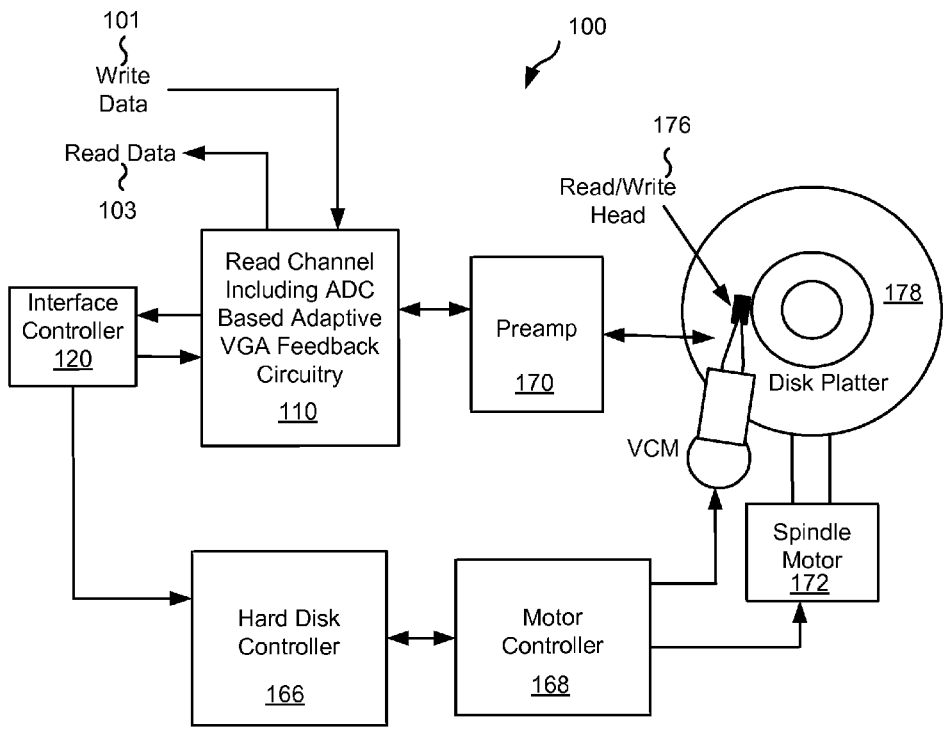
FIG. 1 shows a storage system including a read channel circuit having ADC based adaptive VGA feedback circuitry in accordance with some embodiments of the present invention.

Turning to FIG. 1, a storage system 100 including a read channel circuit 110 having ADC based adaptive VGA feedback circuitry is shown in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

During operation, data accessed from disk platter 178 is processed using a data processing circuit. The data processing circuit applies a variable gain amplification to an analog signal received from preamplifier 170, and the amplified output is processed including converting a signal derived from the amplified output to a series of corresponding digital samples, and the digital samples are equalized to yield an equalized output. The equalized output is then provided to a data processing circuit including both a data detector circuit and a data decoder circuit. The data detector circuit applies a data detection algorithm to the equalized output to yield a detected output. A target filter filters the detected output using an ADC based target to yield a target output. A difference between the target output and the equalized output is calculated to yield an error value. The error value is used to modify the gain of the variable gain amplification, and to guide adaptation of the ADC based target. In some cases, the data processing circuit may include the circuitry discussed below in relation to FIG. 3, and/or may operate consistent with the method discussed below in relation to FIG. 4.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 2:
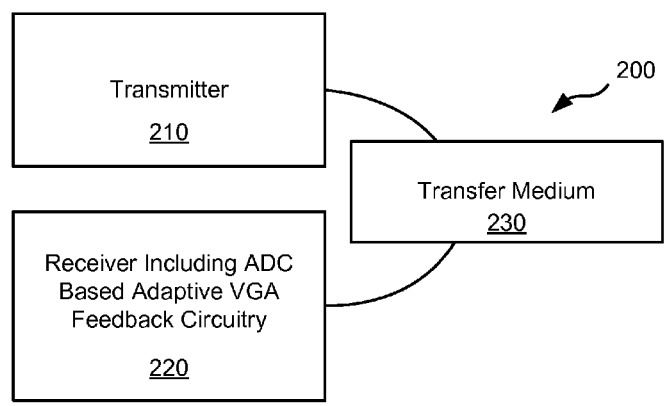
FIG. 2 depicts a communication system including a receiver having ADC based adaptive VGA feedback circuitry in accordance with various embodiments of the present invention.

Turning to FIG. 2, a communication system 200 including a receiver 220 having ADC based adaptive VGA feedback circuitry is shown in accordance with some embodiments of the present invention. Communication system 200 includes a transmitter 210 that is operable to transmit encoded information via a transfer medium 230 as is known in the art. The encoded data is received from transfer medium 230 by receiver 220. Transfer medium 230 may be any transfer medium known in the art including, but not limited to, a wireless medium, a wired medium, an optical medium, or the like. Based upon the disclosure provided herein, one of ordinary skill in the art will recognize a variety of transfer mediums that may be used in relation to different embodiments of the present invention.

During operation, information is transferred by transmitted 210 to receiver 220 via transfer medium 230. The information received by receiver 220 is processed using a data processing circuit. The data processing circuit applies a variable gain amplification to an analog signal received from an analog input circuit included as part of receiver 220, and the amplified output is processed including converting a signal derived from the amplified output to a series of corresponding digital samples, and the digital samples are equalized to yield an equalized output. The equalized output is then provided to a data processing circuit including both a data detector circuit and a data decoder circuit. The data detector circuit applies a data detection algorithm to the equalized output to yield a detected output. A target filter filters the detected output using an ADC based target to yield a target output. A difference between the target output and the equalized output is calculated to yield an error value. The error value is used to modify the gain of the variable gain amplification, and to guide adaptation of the ADC based target. In some cases, the data processing circuit may include the circuitry discussed below in relation to FIG. 3, and/or may operate consistent with the method discussed below in relation to FIG. 4.

Figure 3:
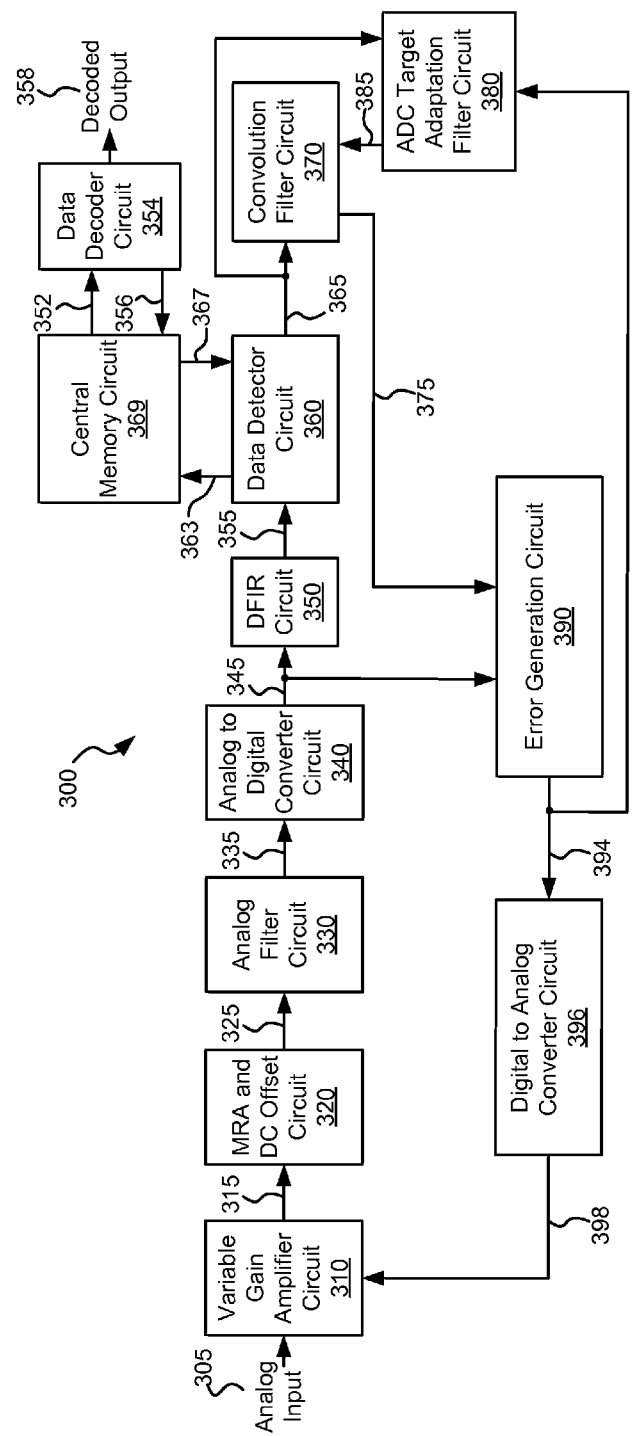
FIG. 3 shows a data processing circuit including ADC based adaptive VGA feedback circuitry in accordance with some embodiments of the present invention.

Turning to FIG. 3, a data processing circuit 300 including ADC based adaptive VGA feedback circuitry in accordance with some embodiments of the present invention. Data processing circuit 300 includes a variable gain amplifier circuit 310 that applies a variable gain to an analog input 305 to yield an amplified output 315. The applied gain corresponds to a gain feedback value 398. Variable gain amplifier circuit 310 may be any circuit known in the art that is capable of modifying a received input by a gain corresponding to a gain input. Based upon the disclosure provided herein, one of ordinary skill in the art will recognize a variety of variable gain amplifier circuits that may be used in relation to different embodiments of the present invention.

Amplified output 315 is provided to a magnetoresistive head asymmetry compensation and DC offset compensation circuit 320 that in turn provides a compensated output 325. Circuit 320 may be any circuit known in the art that is capable of reducing the effects of magnetoresistive head asymmetry and/or DC offset. Based upon the disclosure provided herein, one of ordinary skill in the art will recognize a variety of magnetoresistive head asymmetry compensation circuits and/or DC offset circuits that may be used in relation to different embodiments of the present invention.

Compensated output 325 is provided to an analog filter circuit 330 that applies continuous time filtering to the received input to yield a filtered analog output 335. Analog filter circuit 330 may be any circuit known in the art that is capable of filtering an analog input signal to yield a filtered output. Based upon the disclosure provided herein, one of ordinary skill in the art will recognize a variety of analog filter circuits that may be used in relation to different embodiments of the present invention.

An analog to digital converter circuit 340 converts filtered analog output 335 to a corresponding digital samples 345. Analog to digital converter circuit 340 may be any circuit known in the art that is capable of converting a continuous time signal in to a series of discrete samples. Based upon the disclosure provided herein, one of ordinary skill in the art will recognize a variety of analog to digital converter circuits that may be used in relation to different embodiments of the present invention. The series of digital samples are provided to an equalizer circuit 350. Equalizer circuit 350 may be any circuit known in the art that is capable of equalizing a data input. In some cases, equalizer circuit 350 is implemented as a digital finite impulse response (DFIR) filter as are known in the art. Equalizer circuit 350 filters the received input and provides a corresponding equalized output 355.

Equalized output 355 is provided to a data detector circuit 360. Data detector circuit 360 applies a data detection algorithm to equalized output 355 to yield a detected output 363. In some embodiments of the present invention, the data detection algorithm is a maximum a posteriori data detection algorithm as are known in the art. In other embodiments of the present invention, the data detection algorithm may be a Viterbi data detection algorithm as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention.

Detected output 363 is provided to a central memory circuit 369 where it is maintained until a data decoder circuit 354 is available. When available, data decoder circuit 354 retrieves detected output 363 as a decoder input 352 from central memory circuit 369, and applies a data decode algorithm to detected output 363 to yield a decoded output 358. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Where decoded output 358 converges (i.e., corresponds to the originally written data set), it is provided as an output. Otherwise, where decoded output 358 fails to converge and a timeout condition has not yet been met, data decoder circuit 354 provides an interim decode result 356 to central memory circuit 350 where it is maintained until data detector circuit 360 is ready to process the result again. When it is available, data detector circuit 360 accesses interim decode result 356 as a detector input 367 from central memory circuit 369 and applies the data detection algorithm again to equalized output 355 guided by interim decode result 356.

Hard decision data corresponding to detected output 363 are provided as a detected output 365 to both a convolution filter circuit 370 and an ADC target adaptation filter circuit 380. Convolution filter circuit 370 convolves detected output 365 with an ADC based target 385 from ADC target adaptation filter circuit 380 to yield a target output 375. In one particular embodiment of the present invention, convolution filter circuit 370 generates target output 375 in accordance with the following equation:

$$\text{Target Output}(k) = \sum_{j=0}^{D-1} (ADC \text{ Based Target})_j b_{k-j},$$

where k indicates a particular instance, b (i.e., $b_1, b_2, b_3 \ldots$) is received as detected output 365, ADC Based Target (i.e., $T_0, T_1, T_2 \ldots$) are target taps provided as ADC based target 385, and D corresponds to the total number of target taps. In some embodiments of the present invention, ADC based target 385 includes five values (i.e., $T_0, T_1, T_2, T_3, T_4$ and D=5). Based upon the disclosure provided herein, one of ordinary skill in the art will recognize other numbers of filter taps that may be used in relation to different embodiments of the present invention.

The series of digital samples 345 and target output 375 are both provided to an error generation circuit 390. Error generation circuit 390 calculates a difference between corresponding instances of digital samples 345 and target output 375 across a number of samples to yield an error value 394. In one particular embodiment of the present invention, error generation circuit 390 calculates error value 394 as a running average in accordance with the following equation:

$$\text{Error Value}(k) = \sum_{j=0}^{N-1} (\text{Target } Output_j - \text{Digital } Sample_j),$$

where k indicates a particular instance, the $j^{th}$ Target Output and Digital Sample are corresponding instances of target output 375 and digital samples 345, and N is the number of corresponding instances incorporated in the running average. Based upon the disclosure provided herein, one of ordinary skill in the art will recognize a variety of approaches that may be used to calculate error value 394 in accordance with different embodiments of the present invention. Error value 394 is provided to a digital to analog converter circuit 396 that is operable to generate a continuous or analog gain feedback value 398 that in part governs the operation of variable gain amplifier circuit 310. Digital to analog converter circuit 396 may be any circuit known in the art that is capable of converting a series of discrete inputs into a corresponding analog signal. Based upon the disclosure provided herein, one of ordinary skill in the art will recognize a variety of digital to analog converter circuits that may be used in relation to different embodiments of the present invention.

ADC target adaptation filter circuit 380 adaptively modifies ADC based target 385 based upon error value 394. In some embodiments of the present invention, the adaptation by ADC target adaptation filter circuit 380 is done by searching through combinations of values of ADC based target 385 to identify a minimum value of error value 394. In some cases, a comprehensive search through all possible values of ADC based target 385 is performed to identify the minimum. Once the minimum is identified, the ADC based target 385 corresponding to the minimum is used to control operation of data processing circuit 300. In other cases, a less comprehensive search is performed. For example, where ADC based target 385 is composed of five values, the first and second values are set equal to a logic '1', the fourth and fifth values are set equal to a logic '0', and the third (center) value is tested as both a logic '1' and a logic '0' to determine which yields the lowest value of error value 394. The center value yielding the lowest value of error value 394 is fixed, and a search is performed for the other values of ADC based target 385. Based upon the disclosure provided herein, one of ordinary skill in the art will recognize other algorithms that may be used by ADC target adaptation filter circuit 380 to adaptively modify ADC based target 385 using error value 394.

Figure 4A:
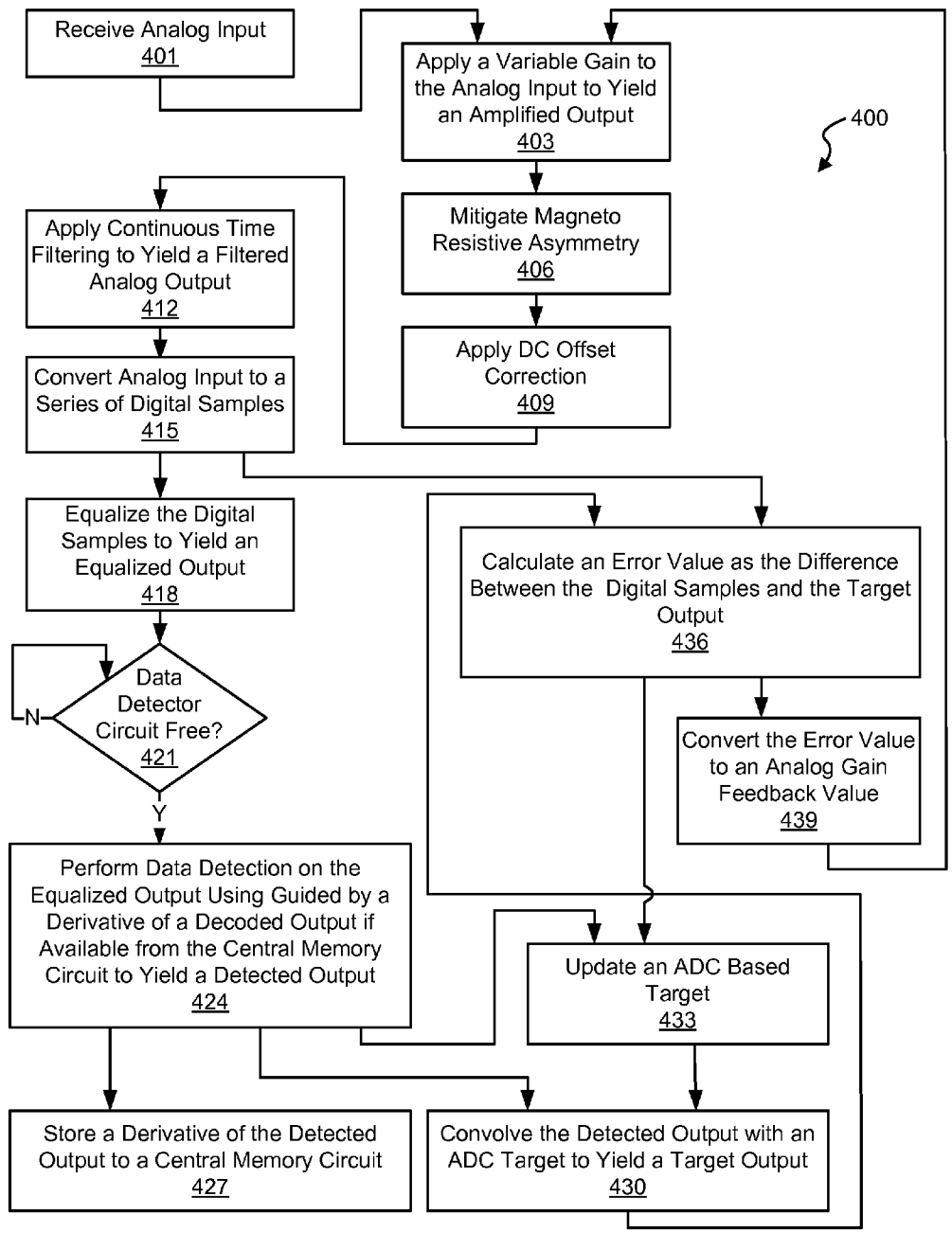
FIGS. 4a-4b are flow diagrams showing a method in accordance with various embodiments of the present invention for ADC based adaptive variable gain amplification.
Figure 4B:
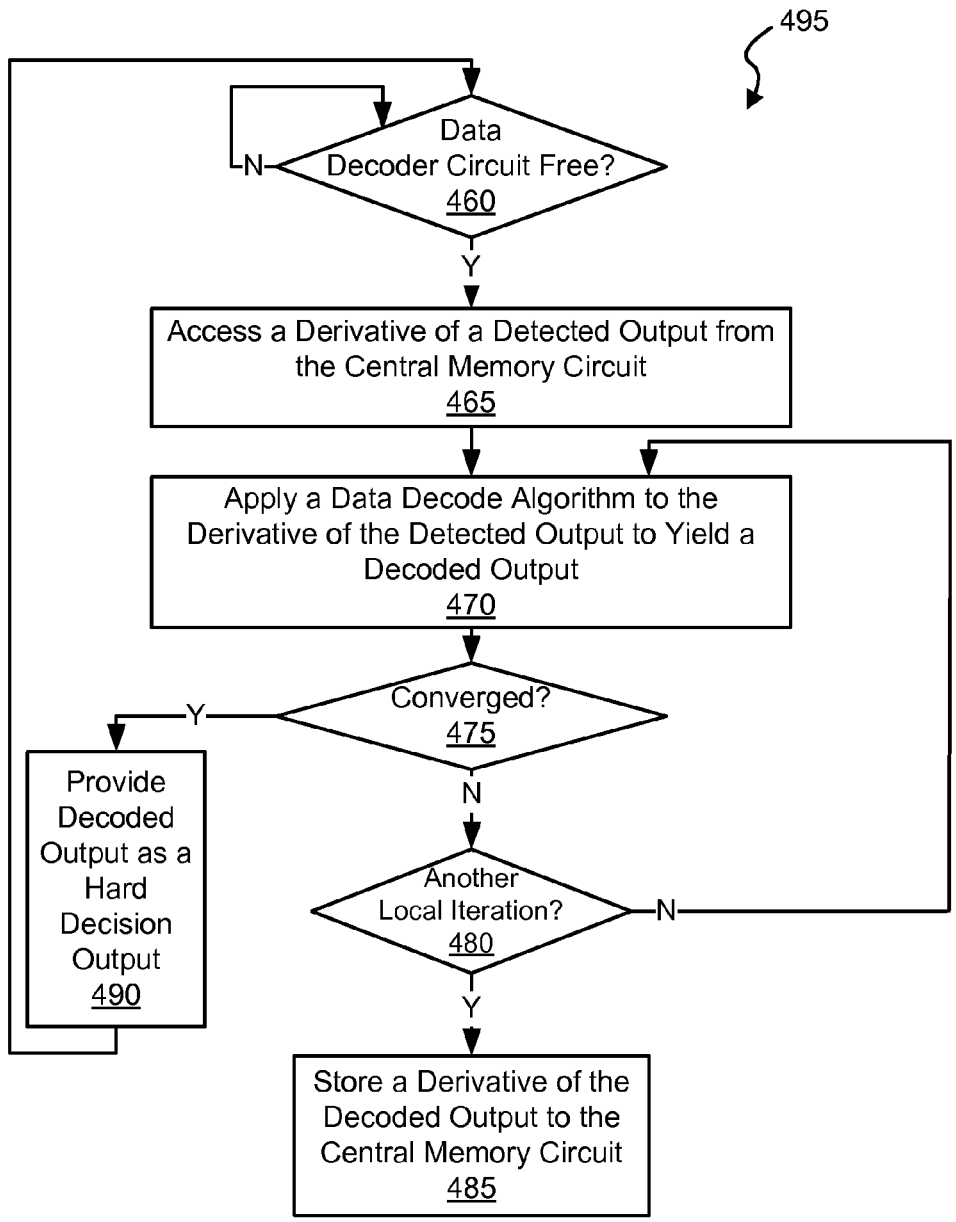

Turning to FIGS. 4a-4c, flow diagrams 400, 450 and 495 show a method in accordance with various embodiments of the present invention for ADC based adaptive variable gain amplification. Following flow diagram 400 of FIG. 4a, an analog input is received (block 401). The analog input may be derived from, for example, a storage medium or a data transmission channel. Based upon the disclosure provided herein, one of ordinary skill in the art will recognize a variety of sources of the analog input. The analog input is amplified by a variable gain corresponding to an analog gain feedback value (block 403). The amplification may be done using any variable gain amplification known in the art. Magneto resistive asymmetry is mitigated (block 406), and any DC offset in the amplified signal is corrected (block 409). The magneto resistive asymmetry may be mitigated using any circuit known in the art that is capable of reducing magneto resistive asymmetry, and the DC offset may be corrected using any DC offset correction circuit known in the art. A continuous time filtering is applied to the compensated output to yield a filtered analog output (block 412). Any analog filter circuit known in the art may be used to perform the continuous time filtering.

The filtered analog output is converted to a series of digital samples (block 415). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 418). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 421). Where a data detector circuit is available (block 421), a data detection algorithm is applied to the equalized output guided by a derivative of a decoded output where available (e.g., the second and later iterations through the data detector circuit and the data decoder circuit) from a central memory circuit to yield a detected output (block 424). In some embodiments of the present invention, the data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 427).

In addition, the detected output (block 424) is convolved with an adaptively modified ADC based target (from block 433) to yield a target output (block 430). The convolution may be done consistent with the following equation:

$$\text{Target Output}(k) = \sum_{j=0}^{D-1} (ADC \text{ Based Target})_j b_{k-j},$$

where k indicates a particular instance, b (i.e., $b_1, b_2, b_3 \ldots$) is received as detected output 365, ADC Based Target (i.e., $T_0, T_1, T_2 \ldots$) are target taps provided as ADC based target 385, and D corresponds to the total number of target taps. In some embodiments of the present invention, ADC based target 385 includes five values (i.e., $T_0, T_1, T_2, T_3, T_4$ and D=5). Based upon the disclosure provided herein, one of ordinary skill in the art will recognize other numbers of filter taps that may be used in relation to different embodiments of the present invention.

An error value is calculated as the difference between the digital samples (block 415) and the target output (block 430) (block 436). In some embodiments of the present invention, the error value is calculated in accordance with the following equation:

$$\text{Error Value}(k) = \sum_{j=0}^{N-1} (\text{Target } Output_j - \text{Digital } Sample_j),$$

where k indicates a particular instance, j indicates a corresponding instance of the target output and the digital samples, and N is the number of corresponding instances incorporated in the running average. The error value is converted to an analog gain feedback value that controls the gain applied by the variable gain amplification process of block 403 (block 439).

In addition, the ADC based target is updated based in part on the detected output and the error value (block 433). In some embodiments of the present invention, the adaptation of the ADC based target is done by searching through combinations of values of the ADC based target to identify a minimum of the error value. In some cases, a comprehensive search through all possible ADC based targets is performed to identify the minimum. Once the minimum is identified, the ADC based target corresponding to the minimum is used to control future data processing. In other cases, a less comprehensive search is performed. For example, where the ADC based target is composed of five values, the first and second values are set equal to a logic '1', the fourth and fifth values are set equal to a logic '0', and the third (center) value is tested as both a logic '1' and a logic '0' to determine which yields the lowest error value. The center value yielding the lowest error value is fixed, and a search is performed for the other ADC based targets. Based upon the disclosure provided herein, one of ordinary skill in the art will recognize other algorithms that may be used to adapt the ADC based target.

Turning to FIG. 4b, a flow diagram 495 shows a counterpart to the method of FIG. 4a including data decoding. Following flow diagram 495, it is determined whether the data decoder circuit is free (block 460). The data decoder circuit may be, for example, a low density data decoder circuit as are known in the art. Where the data decoder circuit is available (block 460), a previously stored derivative of a detected output (e.g., that stored by block 427 of FIG. 4a) is accessed from the central memory and used as a received codeword (block 465). A data decode algorithm is applied to the received codeword to yield a decoded output (block 470). Where a previous local iteration has been performed on the received codeword, the results of the previous local iteration (i.e., a previous decoded output) are used to guide application of the decode algorithm. It is then determined whether the decoded output converged (i.e., resulted in the originally written data) (block 475). Where the decoded output converged (block 475), it is provided as a hard decision output (block 490). Alternatively, where the decoded output failed to converge (block 475), it is determined whether another local iteration is desired (block 480). In some cases, four local iterations are allowed. Based upon the disclosure provided herein, one of ordinary skill in the art will recognize another number of local iterations that may be used in relation to different embodiments of the present invention. Where another local iteration is desired (block 480), the processes of blocks 460-490 are repeated for the codeword. Alternatively, where another local iteration is not desired (block 475), a derivative of the decoded output is stored to the central memory (block 485). The derivative of the decoded output being stored to the central memory triggers the data set ready query of block 421 to begin the data detection process.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    an analog to digital converter circuit operable to convert an analog input into corresponding digital samples;
    a data detector circuit operable to apply a data detection algorithm to a data set derived from the digital samples to yield a detected output;
    a filter circuit operable to convolve the detected output with a target parameter to yield a target output;
    an error generation circuit operable to calculate an error value as a difference between the digital samples and the target output; and
    a target parameter adaptation circuit configured to receive the error value as an input and to update the target parameter based at least in part on the error value, wherein the target parameter adaptation circuit is further operable to compare an error value corresponding to a first value of the target parameter with an error value corresponding to a second value of the target parameter, and to select the first value for the target parameter where the error value corresponding to the first value is less than the error value corresponding to the second value.

2. The data processing system of claim 1, wherein the data processing system further comprises:
    a variable gain amplifier circuit operable to amplified a received signal by a gain to yield an amplified signal, wherein the analog input is derived from the amplified signal; and
    wherein the gain is governed at least in part by the error value.

3. The data processing system of claim 1, wherein convolving the detected output with the target parameter to yield the target output is done in accordance with the following equation:

$$\text{Target Output}(k) = \sum_{j=0}^{D-1} (\text{Target Parameter})_j b_{k-j},$$

wherein k indicates a particular instance, b is the detected output, j is a counter value, and D corresponds to the total number of values in the target parameter.

4. The data processing system of claim 1, wherein the target output is a five value output.

5. The data processing system of claim 1, wherein the system further comprises:
    an equalizer circuit operable to equalize the digital samples to yield the data set.

6. The data processing system of claim 1, wherein the target parameter adaptation circuit is operable to select the first value of the target parameter and to store the error value corresponding to the first value, and to select the second value of the target parameter and to store the error value corresponding to the second value.

7. The data processing system of claim 1, wherein the data detection algorithm is selected from a group consisting of: a Viterbi data detection algorithm, and a maximum a posteriori data detection algorithm.

8. The data processing system of claim 1, wherein the system is implemented as part of a device selected from a group consisting of: a storage device and a receiving device.

9. The data processing system of claim 1, wherein the data processing system is implemented as part of an integrated circuit.

10. A method for data processing, the method comprising:
converting an analog input into a corresponding series of digital samples using an analog to digital converter circuit;
applying a data detection algorithm to a data set derived from the digital samples to yield a detected output;
convolving the detected output with a target parameter to yield a target output;
calculating an error value as a difference between the digital samples and the target output; and
updating the target parameter based at least in part on the error value, wherein updating the target parameter based at least in part on the error value includes:
comparing an error value corresponding to a first value with an error value corresponding to a second value; and
selecting the first value for the target parameter where the error value corresponding to the first value is less than the error value corresponding to the second value.

11. The method of claim 10, wherein the method further comprises:
amplifying a received signal by a gain to yield an amplified signal, wherein the analog input is derived from the amplified signal; and
wherein the gain varies based at least in part on the error value.

12. The method of claim 10, wherein convolving the detected output with the target parameter to yield the target output is done in accordance with the following equation:

$$\text{Target Output}(k) = \sum_{j=0}^{D-1} (\text{Target Parameter})_j b_{k-j},$$

wherein k indicates a particular instance, b is the detected output, j is a counter value, and D corresponds to the total number of values in the target parameter.

13. The method of claim 10, wherein the target output is a five value output.

14. The method of claim 10, wherein the method further comprises:
equalizing the digital samples to yield the data set.

15. The method of claim 10, wherein updating the target parameter based at least in part on the error value comprises:
selecting the first value of the target parameter;
storing the error value corresponding to the first value;
selecting the second value of the target parameter; and
storing the error value corresponding to the second value.

16. The method of claim 10, wherein the data detection algorithm is selected from a group consisting of: a Viterbi data detection algorithm, and a maximum a posteriori data detection algorithm.

17. A storage device, the storage device comprising:
a storage medium;
a head assembly disposed in relation to the storage medium and operable to provide a sensed signal corresponding to information on the storage medium;
a read channel circuit including:
an analog to digital converter circuit operable to convert an analog input derived from the sensed signal into corresponding digital samples;
a data detector circuit operable to apply a data detection algorithm to a data set derived from the digital samples to yield a detected output;
a filter circuit operable to convolve the detected output with a target parameter to yield a target output;
an error generation circuit operable to calculate an error value as a difference between the digital samples and the target output; and
a target parameter adaptation circuit operable to update the target parameter based at least in part on the error value, wherein the target parameter adaptation circuit is operable to select a first value of the target parameter and to store the error value corresponding to the first value, and to select a second value of the target parameter and to store the error value corresponding to the second value, and wherein the target parameter adaptation circuit is further operable to compare the error value corresponding to the first value of the target parameter with the error value corresponding to the second value of the target parameter, and to select the first value for the target parameter where the error value corresponding to the first value is less than the error value corresponding to the second value.

18. The storage device of claim 17, wherein the read channel circuit further comprises:
a variable gain amplifier circuit operable to amplified a received signal by a gain to yield an amplified signal, wherein the analog input is derived from the amplified signal; and
wherein the gain is governed at least in part by the error value.

19. The storage device of claim 17, wherein the target output is a five value output.

20. The storage device of claim 17, wherein the device further comprises:
an equalizer circuit operable to equalize the digital samples to yield the data set.

* * * * *